United States Patent
Fujita et al.

(10) Patent No.: US 6,819,585 B2
(45) Date of Patent: Nov. 16, 2004

(54) MAGNETIC RANDOM ACCESS MEMORY

(75) Inventors: Katsuyuki Fujita, Yokohama (JP); Yoshihisa Iwata, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/368,456

(22) Filed: Feb. 20, 2003

(65) Prior Publication Data

US 2004/0057277 A1 Mar. 25, 2004

(30) Foreign Application Priority Data

Sep. 25, 2002 (JP) ........................................ 2002-279745

(51) Int. Cl.[7] ............................................. G11C 11/00
(52) U.S. Cl. .................. 365/158; 365/158; 365/185.23
(58) Field of Search ............................ 365/158, 185.23, 365/185.22, 189.09, 185.29, 185.14, 189.05

(56) References Cited

U.S. PATENT DOCUMENTS 5,574,679 A 11/1996 Ohtsuki et al.
5,920,508 A * 7/1999 Miyakawa et al. ..... 365/185.22
6,052,313 A * 4/2000 Atsumi et al. ......... 365/189.05
6,285,594 B1 * 9/2001 Bill et al. .............. 365/185.23
6,388,921 B1 * 5/2002 Yamamoto et al. ..... 365/185.11

* cited by examiner

Primary Examiner—David Nelms
Assistant Examiner—Thinh T Nguyen
(74) Attorney, Agent, or Firm—Oblon, Spivak, McClelland, Maier & Neustadt, P.C.

(57) ABSTRACT

One end of a write word line is connected to a decoder/driver unit. The decoder/driver unit is constituted by a P channel MOS transistor, an N channel MOS transistor, and an NAND circuit. When WRITE, CHRDY and RA1 all become "H", an output signal from the NAND circuit becomes "H", and a write current flows through the write word line. CHRDY is a signal which becomes "H" upon completion of an initialization operation of all internal circuits after turning on a power supply. A limiting circuit is constituted by a clamp circuit which limits a potential of a write word line to a fixed value or a lower value.

11 Claims, 5 Drawing Sheets

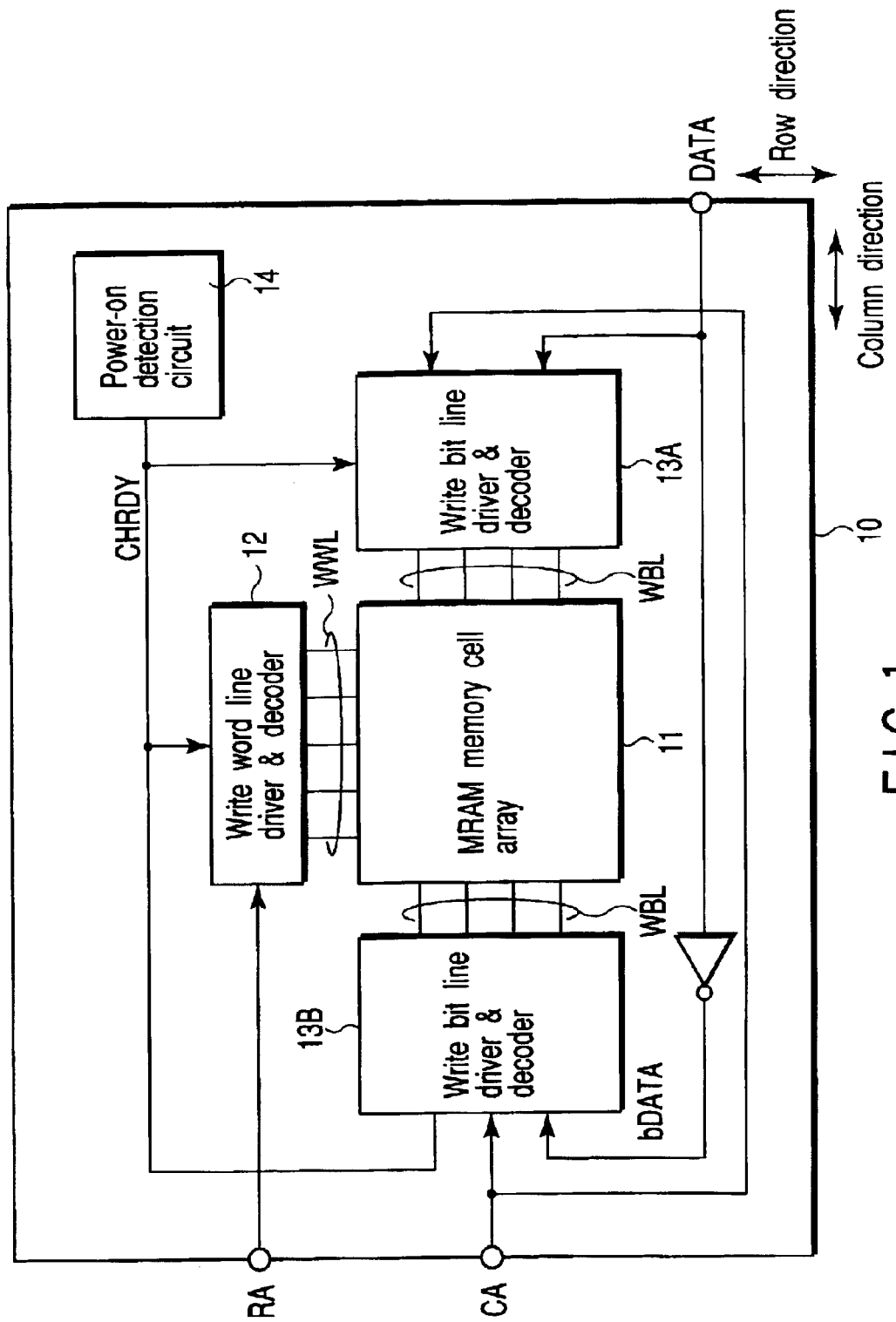
F I G. 1

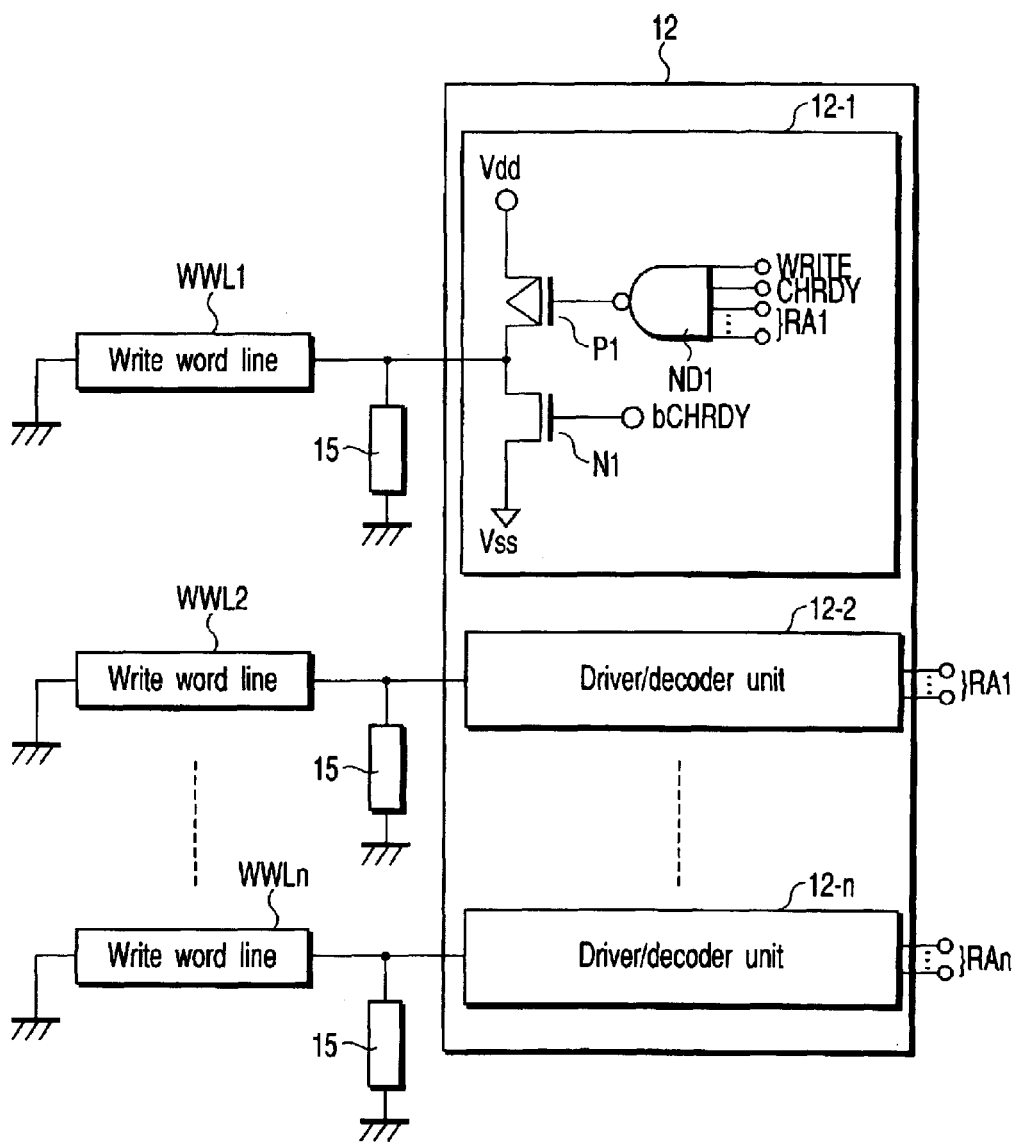
F I G. 5
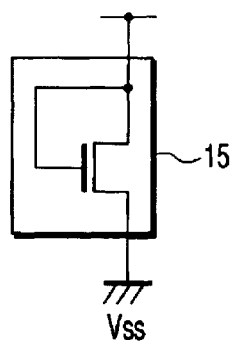
F I G. 7
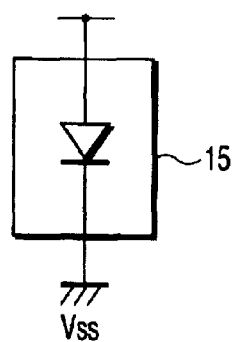
F I G. 8

MAGNETIC RANDOM ACCESS MEMORY

CROSS-REFERENCE TO RELATED APPLICATIONS

This application is based upon and claims the benefit of priority from the prior Japanese Patent Application No. 2002-279745, filed Sep. 25, 2002, the entire contents of which are incorporated herein by reference.

BACKGROUND OF THE INVENTION

1. Field of the Invention

The present invention relates to a magnetic random access memory (MRAM) which uses a magneto-resistive effect element as a storage element.

2. Description of the Related Art

In recent years, research and development of a magnetic random access memory which stores data in a non-volatile manner by utilizing a magneto-resistive effect have been frequently carried out.

The magnetic random access memory stores data "1" and "0" by using a magneto-resistive effect element (a TMR element, a GMR element or the like). The basic structure of the magneto-resistive effect element is a structure sandwiching a tunneling barrier by two magnetic layers.

Data stored in the magneto-resistive effect element is judged by whether directions of magnetization of the two magnetic layers are the same (parallel state) or opposite to each other (anti-parallel state).

Here, an anti-magnetic layer for fixing a direction of magnetization of a fixed layer is brought into contact with one (fixed layer) of the two magnetic layers. As a result, data to be stored in the magneto-resistive effect element is actually determined based on a direction of magnetization of the other one (free layer) of the two magnetic layers.

When magnetization of the magneto-resistive effect element enters the parallel state, the tunnel resistance of the tunneling barrier sandwiched between the two magnetic layers constituting the magneto-resistive effect element becomes lowest. This state is, for example, the state "1". Further, when magnetization of the magneto-resistive effect element enters the anti-parallel state, the tunnel resistance of tunneling barrier sandwiched between the two magnetic layers constituting the magneto-resistive effect element becomes highest. This state is, for example, the state "0".

In the magnetic random access memory, a write current is used when programming data. The write current is caused to flow through two write lines crossing each other at a point where the magneto-resistive effect element is positioned. The state of magnetization of the magneto-resistive effect element is controlled by a combined magnetic field generated by the write current flowing through the two write lines.

In the conventional magnetic random access memory, however, an address decoder may become unstable when turning on a power supply in some cases. In this case, an unexpected row/column address is selected, a write current flows through a write word/bit line corresponding to that row/column address, and data in an arbitrary cell may be possibly destroyed by erroneous writing.

Such a phenomenon becomes a problem when using the magnetic random access memory as a ROM in particular.

BRIEF SUMMARY OF THE INVENTION

A magnetic random access memory according to an aspect of the present invention comprises: a memory cell array determining an element having a magnetic layer as a memory cell; a first write line for writing data in a memory cell; a first decoder which selects the first write line based on a first address signal; and a first driver which is connected to one end of the first write line and supplies a write current to the first write line when the first write line is selected by the first decoder, and the first decoder is maintained in a non-active state until an initialization operation of an internal circuit is completed after turning on a power supply.

BRIEF DESCRIPTION OF THE SEVERAL VIEWS OF THE DRAWING

FIG. 1 is a block diagram showing a primary part of a semiconductor memory according to an aspect of the present invention;

FIG. 5 is a circuit diagram showing another aspect of the write word line driver/decoder;

FIG. 7 is an aspect of a clamp circuit; and

FIG. 8 is a view showing another aspect of the clamp circuit.

DETAILED DESCRIPTION OF THE INVENTION

A magnetic random access memory concerning an aspect of the present invention will now be described in detail hereinafter with reference to the accompanying drawing.

1. Entire Structure

FIG. 1 is a block diagram showing a primary part of a magnetic random access memory according to an embodiment of the present invention.

In a memory chip 10 are arranged a memory cell array, for example, an MRAM memory cell array 11 having a magneto-resistive effect element as a memory cell, a write word line driver/decoder 12, write bit line drivers/decoders 13A and 13B, and a power-on detection circuit 14.

The write word line driver/decoder 12 is provided at one end of the memory cell array 11 in a row direction. The write word line driver/decoder 12 has a function to decode a row address signal RA and pass a write current which always flows in one direction through a write word line WWL selected by the row address signal RA in a write operation.

The write bit line driver/decoder 13A is provided at one end of the memory cell array 11 in a column direction, and the write bit line driver/decoder 13B is provided at the other end of the memory cell array 11 in the column direction. The write bit line drivers/decoders 13A and 13B have a function to decode a column address signal CA and pass a write current which flows in a direction according to a value of program data DATA through a write bit line WBL selected by the column address signal CA in a write operation.

The power-on detection circuit 14 has a function to detect that a power supply is turned on. When the power-on detection circuit 14 confirms that an initialization operation of all the internal circuits in the semiconductor memory is completed after turning on the power supply, it changes a detection signal CHRDY from "L" to "H". The detection signal CHRDY is supplied to the write word line driver/decoder 12 and the write bit line drivers/decoders 13A and 13B.

2. Write Word Line Driver/Decoder

Figure 2:
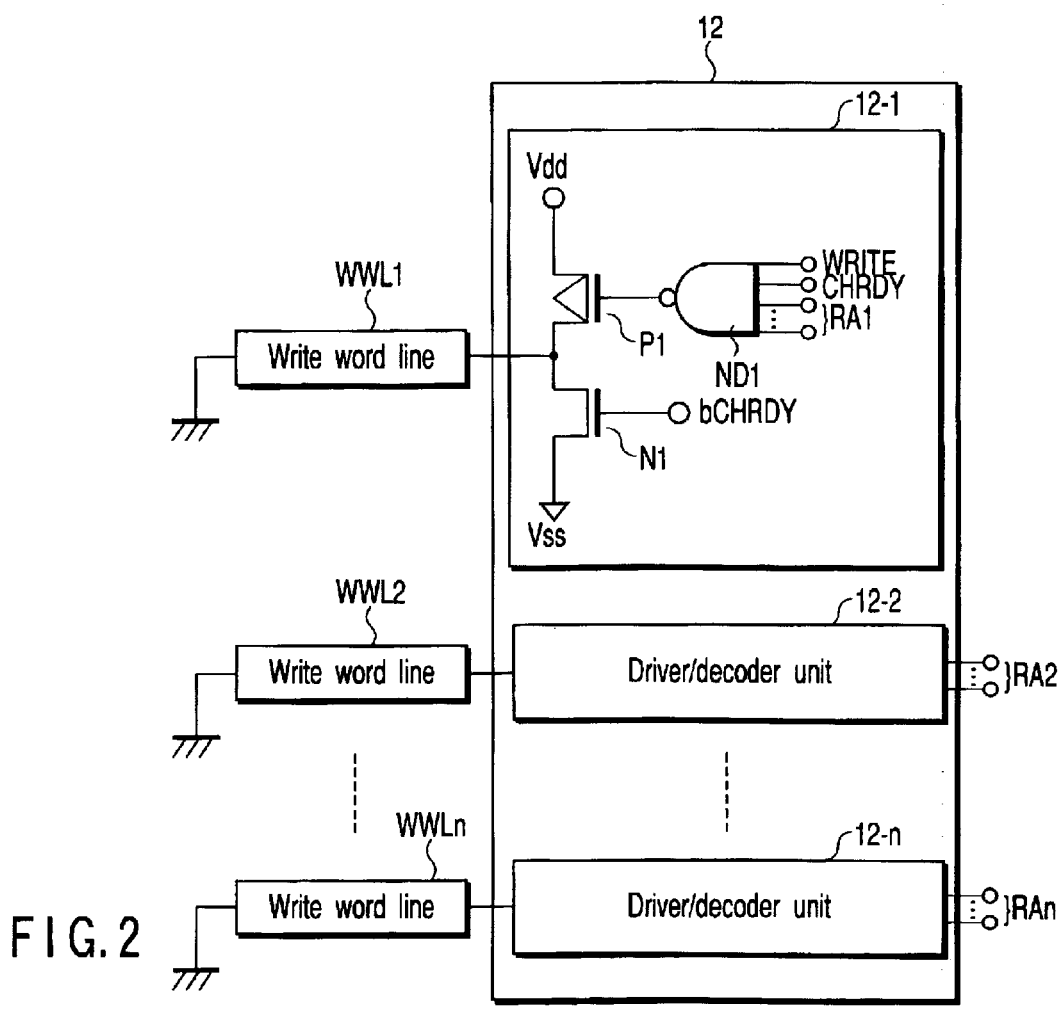
FIG. 2 is a circuit diagram showing an aspect of a write word line driver/decoder.

FIG. 2 shows a circuit example of the write word line driver/decoder.

The write word line driver/decoder 12 is constituted by a plurality of driver/decoder units 12-1, 12-2, . . . 12-n corresponding to a plurality of write word lines WWL1, WWL2, . . . WWLn.

The circuit configurations of the respective driver/decoder units are the same.

When the row address signal RA selects the write word line WWL1, all the bits become "H" with respect to only the row address signal RA1 inputted to the driver/decoder unit 12-1.

In general, when the row address signal RA selects the write word line WWLn, all the bits become "H" with respect to only the row address signal RAn inputted to the driver/decoder unit 12-n.

The driver/decoder unit 12-1 is constituted by a P channel MOS transistor P1 and an N channel MOS transistor N1 connected in series between a power supply terminal Vdd and a ground terminal Vss, and an NAND gate circuit ND1.

To the NAND gate circuit ND1 are inputted a write signal WRITE, a detection signal CHRDY and a row address signal RA1.

The write signal WRITE is a signal which becomes "H" in the write operation. As described above, the detection signal CHRDY becomes "H" when the initialization operation of al the internal circuits in the semiconductor memory is completed after turning on the power supply. Furthermore, when the write current is caused to flow through the write word line WWL1, all the bits of the row address signal RA1 become "H".

An output node of the NAND gate circuit ND1 is connected to a gate of the P channel MOS transistor P1.

Therefore, when all of the write signal WRITE, the detection signal CHRDY and the row address signal RA1 become "H", an output signal from the NAND gate circuit ND1 becomes "L", and the P channel MOS transistor P1 enters the on state. Moreover, when the detection signal CHRDY becomes "H", the N channel MOS transistor N1 enters the off state.

Therefore, at this moment, the write current is supplied from the power supply terminal Vdd to the write word line WWL1.

In this manner, in the write word line driver/decoder 12, under the condition that the detection signal CHRDY becomes "H", the decoder in the driver/decoder unit 12-1, namely, the NAND gate circuit ND1 can determine on/off of the P channel MOS transistor P1 as a driver based on the row address signal RA1.

That is, after turning on the power supply, the detection signal CHRDY is constantly "L" until the initialization operation of all the internal circuits in the semiconductor memory is completed. Therefore, the P channel MOS transistor P1 in each of all the driver/decoder units 12-1, 12-2, . . . 12-n enters the off state, and the N channel MOS transistor N1 enters the on state. All the write word lines WWL1, WWL2, . . . WWLn are maintained at the ground potential Vss until at least the detection signal CHRDY becomes "H".

As a result, the decoding operation by the decoder is inhibited until the initialization operation of all the internal circuits in the semiconductor memory is completed, and all the write word lines WWL1, WWL2, . . . WWLn enter the non-selected state, thereby also preventing destruction of data due to erroneous writing.

3. Write Bit line Driver/Decoder

Figure 3:
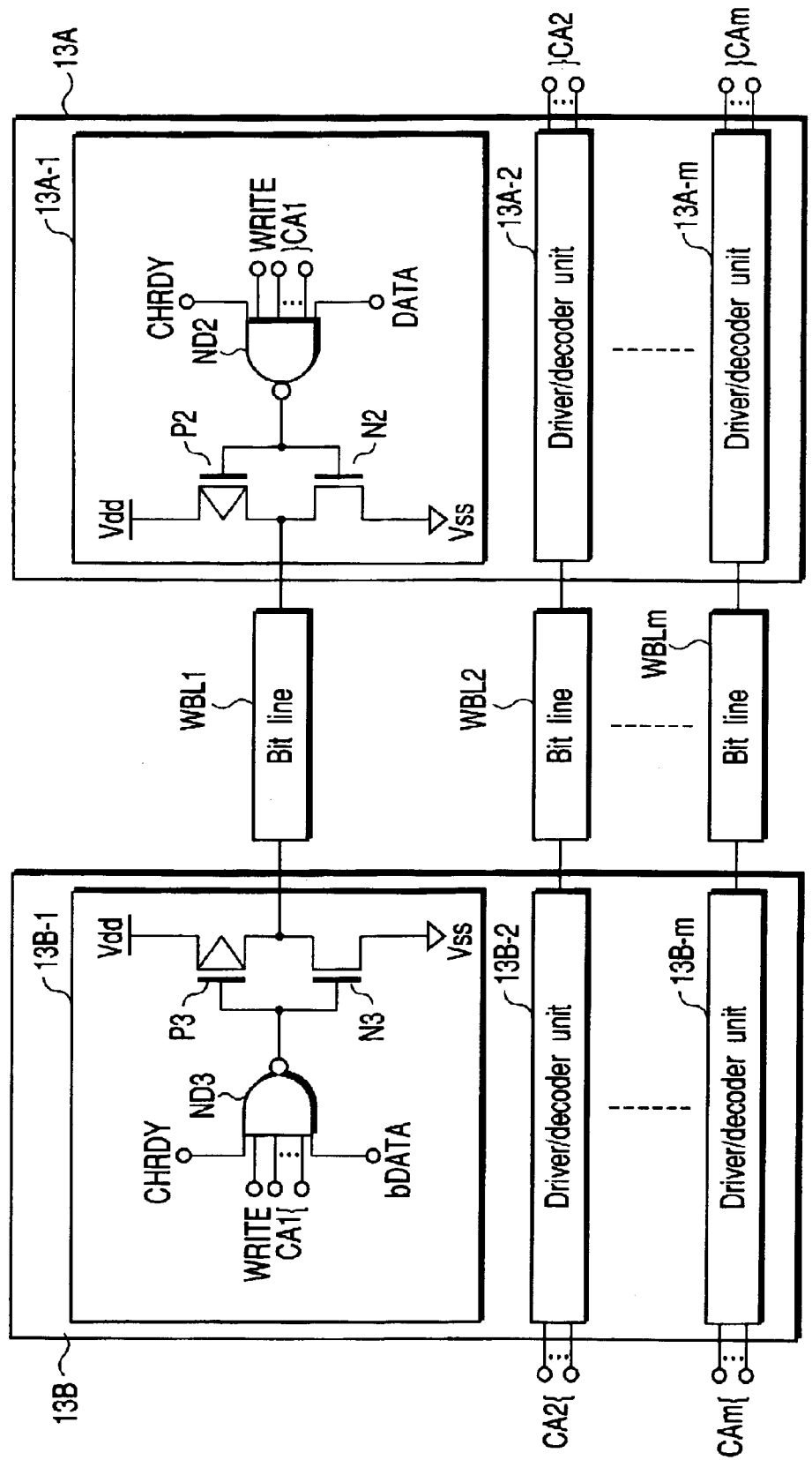
FIG. 3 is a circuit diagram showing an aspect of a write bit line driver/decoder.

FIG. 3 shows a circuit example of the write bit line driver/decoder.

The write bit line drivers/decoders 13A and 13B are constituted by a plurality of driver/decoder units 13A-1, 13A-2, . . . 13A-m, 13B-1, 13B-2, . . . 13B-m corresponding to a plurality of write bit lines WBL1, WBL2, . . . WBLm.

The circuit configurations of the respective driver/decoder units are the same.

When the column address signal CA selects the write bit line WBL1, all the bits become "H" with respect to only the column address signal CA1 inputted to the driver/decoder units 13A-1 and 13B-1.

In general, when the column address signal CA selects the write bit line WBLm, all the bits become "H" with respect to only the column address signal CAm inputted to the driver/decoder units 13A-m and 13B-m.

The driver/decoder unit 13A-1 is constituted by a P channel MOS transistors P2 and an N channel MOS transistor N2 connected in series between a power supply terminal Vdd and a ground terminal Vss, and an NAND gate circuit ND2. The driver/decoder unit 13B-1 is constituted by a P channel MOS transistors P3 and an N channel MOS transistor N3 connected in series between the power supply terminal Vdd and the ground terminal Vss, and an NAND gate circuit ND3.

To the NAND gate circuit ND2 in the driver/decoder unit 13A-1 are inputted a write signal WRITE, a detection signal CHRDY, a column address signal CA1 and program data DATA. To the NAND gate circuit ND3 in the driver/decoder unit 13B-1 are inputted a write signal WRITE, a detection signal CHRDY, a column address signal CA1 and data bDATA which is opposite to the program data.

An output node of the NAND gate circuit ND2 is connected to a gate of the P channel MOS transistor P2 and a gate of the N channel MOS transistor N2, and an output node of the NAND gate circuit ND3 is connected to a gate of the P channel MOS transistor P3 and a gate of the N channel MOS transistor N3.

Therefore, when all of the write signal WRITE, the detection signal CHRDY and the row address signal RA1 become "H", a write current having a direction according to a value of the program data DATA is caused to flow through the write bit line WBL1.

For example, when the program data DATA is "1" (="H"), an output signal from the NAND gate circuit ND2 in the driver/decoder unit 13A-1 becomes "L", the P channel MOS transistor P2 enters the on state, and the N channel MOS transistor N2 enters the off state.

In addition, an output signal from the NAND gate circuit ND3 in the driver/decoder unit 13B-1 becomes "H", the P channel MOS transistor P3 enters the off state, and the N channel MOS transistor N3 enters the on state.

Therefore, at this moment, the write current which is directed from the driver/decoder unit 13A-1 to the driver/decoder unit 13B-1 flows through the write bit line WBL1.

When the program data DATA is "0" (="L"), an output signal from the NAND gate circuit ND2 in the driver/decoder unit 13A-1 becomes "H", the P channel MOS transistor P2 enters the off state, and the N channel MOS transistor N2 enters the on state.

Additionally, an output signal from the NAND gate circuit ND3 in the driver/decoder unit 13B-1 becomes "L", the P channel MOS transistor P3 enters the on state, and the N channel MOS transistor N3 enters the off state.

Therefore, at this moment, the write current which I directed from the driver/decoder unit 13B-1 to the driver/decoder unit 13A-1 flows through the write bit line WBL1.

In this manner, in the write bit line driver/decoders 13A and 13B, under the condition that the detection signal CHRDY becomes "H", the decoders in the driver/decoder units 13A-1 and 13B-1, namely, the NAND gate circuits ND2 and ND3 can likewise determine on/off of the P channel MOS transistors P2, N2, P3 and N3 as drivers based on the column address signal CA1 and the program data DATA.

That is, after tuning on the power supply, the detection signal CHRDY is constantly "L" until the initialization operation of all the internal circuits in the semiconductor memory is completed. Therefore, the P channel MOS transistors P2 and P3 in all the driver/decoder units 13A-1, 13A-2, . . . 13A-m, 13B-1, 13B-2, . . . 13B-m enter the off state, and the N channel MOS transistors N2 and N3 enter the on state. All the write bit lines WBL1, WBL2, . . . WBLm are maintained at the ground potential Vss until at least the detection signal CHRDY becomes "H".

As a result, the decoding operation by the decoders is inhibited until the initialization operation of all the internal circuits in the semiconductor memory is completed, and all the write bit lines WBL1, WBL2, . . . WBLm enter the non-selected state, thereby also preventing destruction of data due to erroneous writing.

4. Operation Waveform

Figure 4:
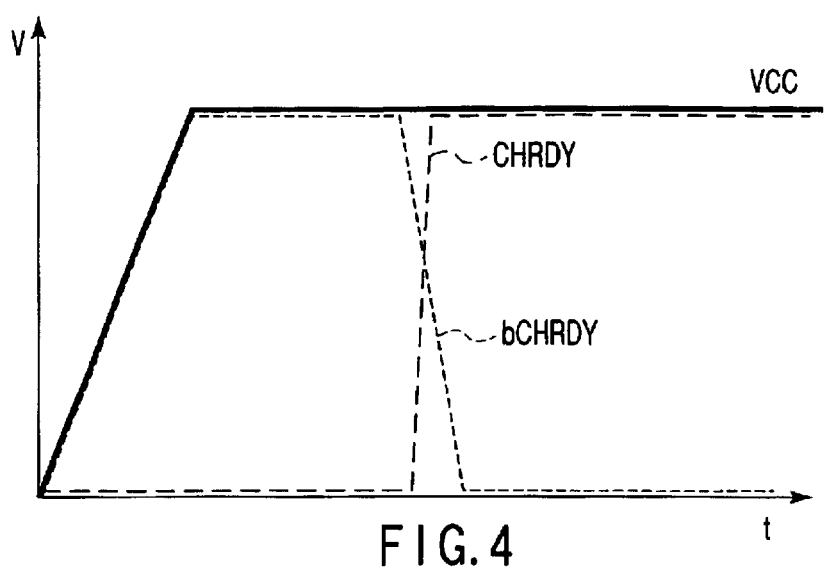
FIG. 4 is a waveform chart showing an aspect of an operation waveform.

FIG. 4 is a waveform chart showing the relationship between the external power supply potential Vcc and the detection signal CHRDY.

When the power supply is turned on, the initialization operation of the internal circuits in the semiconductor memory is first executed. After completion of the initialization operation, the detection signal CHRDY becomes "H", and a detection signal bCHRDY becomes "L".

5. Write Word Line Driver/Decoder (Modification)

FIG. 5 shows a modification of the write word line driver/decoder.

This write word line driver/decoder is characterized in that a circuit which limits a maximum potential generated in the write word line WWLn to a fixed value or a lower value as compared with the write word line driver/decoder shown in FIG. 2.

In the write word line driver/decoder 12 shown in FIG. 2, the write current larger than a designed value may possibly flows through the write word line WWLn due to irregularities in size of the MOS transistors owing to irregularities in process. In this case, not only the possibility of erroneous writing is generated, but the magneto-resistive effect element may be also possibly destroyed.

For example, in case of the magnetic random access memory having a cross point type cell array structure, the magneto-resistive effect element is arranged between the write word line and the write bit line so as to come into contact with them. That is, when a potential difference occurs between the write word line and the write bit line, an unexpected excessive voltage is applied to the magneto-resistive effect element, and the magneto-resistive effect element is destroyed in the worst case.

Thus, in order to avoid such a problem, in this modification, a circuit which limits the maximum potential generated in the write word line WWLn to a fixed value or a lower value is provided to the output nodes of the driver/decoder units 12-1, 12-2, . . . 12-n, thereby preventing destruction of the magneto-resistive effect element from occurring.

The write word line driver/decoder 12 is constituted by a plurality of driver/decoder units 12-1, 12-2, . . . 12-n corresponding to a plurality of the write word lines WWL1, WWL2, . . . WWLn.

The circuit configurations of the respective driver/decoder units are the same.

When the row address signal RA selects the write word line WWL1, all the bits become "H" with respect to only the row address signal RA1 inputted to the driver/decoder unit 12-1. Similarly, when the row address signal RA selects the write word line WWLn, all the bits become "H" with respect to only the row address signal RAn inputted to the driver/decoder unit 12-n.

The driver/decoder unit 12-1 is constituted by a P channel MOS transistor P1 and an N channel MOS transistor N1 connected in series between the power supply terminal Vdd and the ground terminal Vss, and an NAND gate circuit ND1.

A write signal WRITE, a detection signal CHRDY and a row address signal RA1 are inputted to the NAND gate circuit ND1.

The write signal WRITE is a signal which becomes "H" in the write operation. The detection signal CHRDY becomes "H" upon completion of the initialization operation of all the internal circuits in the semiconductor memory after turning on the power supply. Furthermore, in case of passing the write current to the write word line WWL1, all the bits of the row address signal RA1 become "H".

An output node of the NAND gate circuit ND1 is connected to a gate of the P channel MOS transistor P1.

Therefore, when the write signal WRITE, the detection signal CHRDY and the row address signal RA1 all become "H", an output signal from the NAND gate circuit ND1 becomes "L", and the P channel MOS transistor P1 enters the on state. Moreover, when the detection signal CHRDY becomes "H", the N channel MOS transistor N1 enters the off state.

Therefore, at this moment, the write current is supplied from the power supply terminal Vdd to the write word line WWL1.

Here, in this example, a limiting circuit 15 is connected to the output node of the driver/decoder unit 12-1. The limiting circuit 15 has a function to limit the maximum potential generated in the write word line WWL1 to a fixed value or a lower value, and is constituted by, e.g., a clamp circuit.

As a clamp circuit, for example, it is possible to use such an N channel MOS transistor having a gate and a drain which are short-circuited as shown in FIG. 7 or such a diode as shown in FIG. 8. Further, both the MOS transistor in FIG. 7 and the diode in FIG. 8 may be connected to the write word line WWL1.

Since the potential of the write word line WWL1 can be restricted to 0.6 V or a lower value by using the clamp circuit of this example, an unexpected excessive voltage is no longer applied to the magneto-resistive effect element.

6. Write Bit Line Driver/Decoder (Modification)

Figure 6:
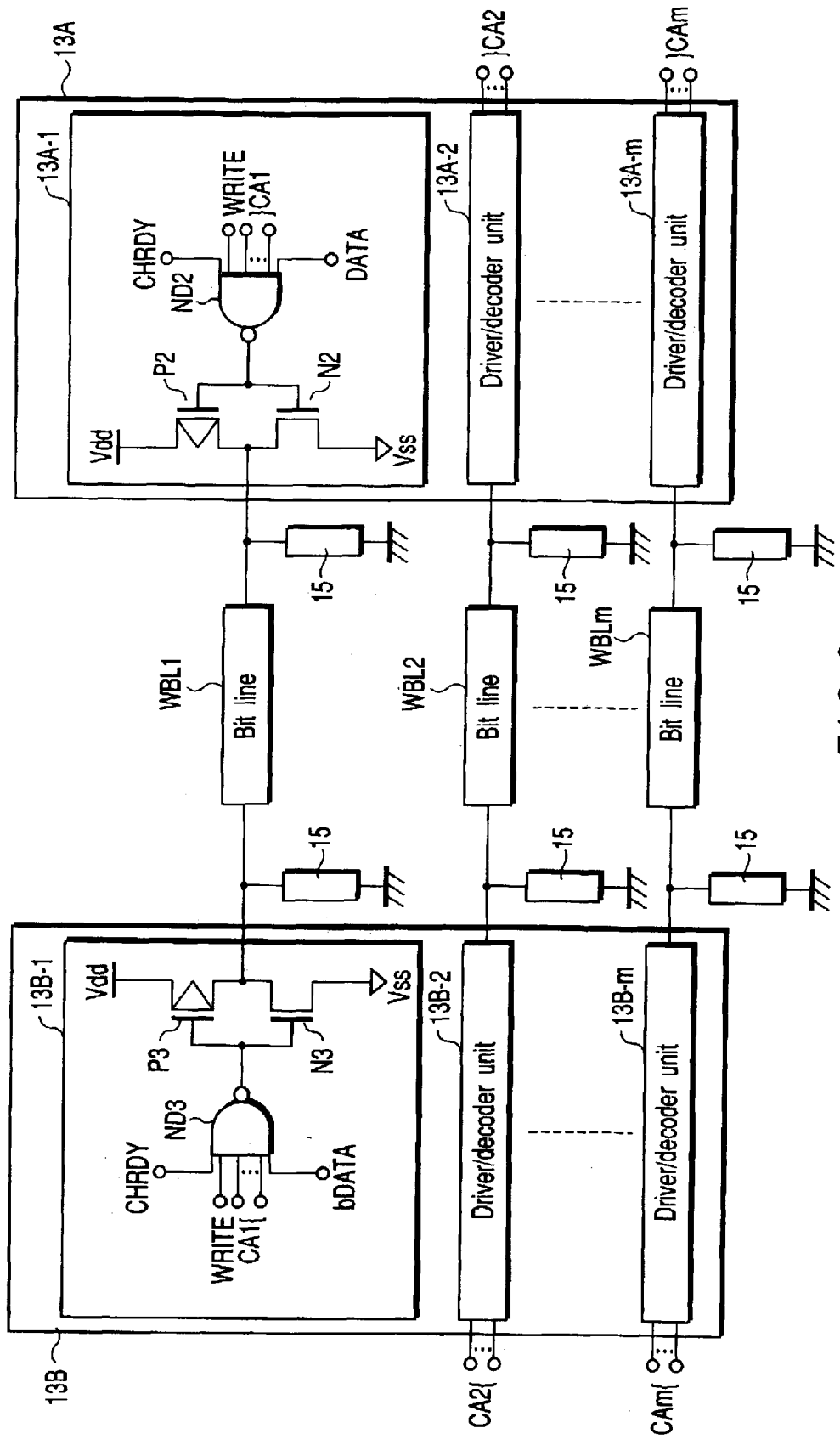
FIG. 6 is a circuit diagram showing another aspect of the write bit line driver/decoder.

FIG. 6 shows a modification of the write bit line driver/decoder.

This write bit line driver/decoder is characterized in that a circuit which limits a maximum potential generated in the write bit line WBLm to a fixed value or a lower value as compared with the write bit line driver/decoder shown in FIG. 3.

In the write bit line driver/decoders 13A and 13B shown in FIG. 3, the write current larger than a designed value may possibly flow through the write bit line WBLm due to irregularities in size of the MOS transistors owing to irregularities in process, for example. In this case, not only the possibility of erroneous writing occurs, but the magneto-resistive effect element may be possibly destroyed.

Such a situation becomes a problem in the magnetic random access memory having the cross point type cell array structure in particular, as in the case of the write word line.

Thus, in order to prevent the magneto-resistive effect element from being destroyed, in this modification, a circuit which limits the maximum potential generated in the write bit line WBLm to a fixed value or a lower value is provided to the output nodes of the driver/decoder units 13A-1, 13A-2, . . . 13A-m, 13B-1, 13B-2, . . . 13B-m, thereby preventing destruction of the magneto-resistive effect element.

The write bit line drivers/decoders 13A and 13B is constituted by a plurality of driver/decoder units 13A-1, 13A-2, . . . 13A-m, 13B-1, 13B-2, . . . 13B-m corresponding to a plurality of write bit lines WBL1, WBL2, . . . WBLm.

The circuit configurations of the respective driver/decoder units are the same.

When the column address signal CA selects the write bit line WBL1, all the bits become "H" with respect to only the column address signal CA1 inputted to the driver/decoder units 13A-1 and 13B-1. Similarly, when the column address signal CA selects the write bit line WBLm, all the bits become "H" with respect to only the column address signal CAm inputted to the driver/decoder units 13A-m and 13B-m.

The driver/decoder unit 13A-1 is constituted by a P channel MOS transistor P2 and an N channel MOS transistor N2 connected in series between the power supply terminal Vdd and the ground terminal Vss, and an NAND gate circuit ND2. The driver/decoder unit 13B-1 is constituted by a P channel MOS transistor P3 and an N channel MOS transistor N3 connected in series between the power supply terminal Vdd and the ground terminal Vss, and an NAND gate circuit ND3.

A write signal WRITE, a detection signal CHRDY, a column address signal CA1 and program data DATA are inputted to the NAND gate circuit ND2 in the driver/decoder unit 13A-1. The write signal WRITE, the detection signal CHRDY, the column address signal CA1, and data bDATA which is opposite to the program data are inputted to the NAND gate circuit ND3 in the driver/decoder unit 13B-1.

An output node of the NAND gate circuit ND2 is connected to a gate of the P channel MOS transistor P2 and a gate of the N channel MOS transistor N2, and an output node of the NAND gate circuit ND3 is connected to a gate of the P channel MOS transistor P3 and a gate of the N channel MOS transistor N3.

Therefore, when all of the write signal WRITE, the detection signal CHRDY and the row address signal RA1 become "H", a write current having a direction according to a value of the program data DATA flows through the write bit line WBL1.

For example, when the program data DATA is "1" (="H"), an output signal from the NAND circuit ND2 in the driver/decoder unit 13A-1 becomes "L", the P channel MOS transistor P2 enters the on state, and the N channel MOS transistor N2 enters the off state.

Further, an output signal from the NAND gate circuit ND3 in the driver/decoder unit 13B-1 becomes "H", the P channel MOS transistor P3 enters the off state, and the N channel MOS transistor N3 enters the on state.

Therefore, at this moment, a write current which is directed to the driver/decoder unit 13B-1 from the driver/decoder unit 13A-1 flows through the write bit line WBL1.

When the program data DATA is "0" (="L"), an output signal from the NAND gate circuit ND2 in the driver/decoder unit 13A-1 becomes "H", the P channel MOS transistor P2 enters the off state, and the N channel MOS transistor N2 enters the on state.

Furthermore, an output signal from the NAND gate circuit ND3 in the driver/decoder unit 13B-1 becomes "L", the P channel MOS transistor P3 enters the on state, and the N channel MOS transistor N3 enters the off state.

Therefore, at this moment, a write current which is directed to the driver/decoder unit 13A-1 from the driver/decoder unit 13B-1 flows through the write bit line WBL1.

Here, in this example, the limiting circuit 15 is connected to the both ends of the write bit line WBL1. The limiting circuit 15 has a function to limit the maximum potential generated in the write bit line WBL1 to a fixed value or a lower value, and is constituted by, e.g., a clamp circuit.

As a clamp circuit, for example, it is possible to use such an N channel MOS transistor having a gate and a drain which are short-circuited as shown in FIG. 7 or such a diode as shown in FIG. 8 can be used. Moreover, both the MOS transistor in FIG. 7 and the diode in FIG. 8 may be connected to the write bit line WBL1.

Since the potential generated in the write bit line WBL1 can be constantly limited to 0.6 V or a lower value, an unexpected excessive voltage is no longer applied to the magneto-resistive effect element.

7. Conclusion

As described above, in the magnetic random access memory according to an aspect of the present invention, after turning on the power supply, the row/column address decoder is set in the non-active state and all the write word/bit lines are set in the non-selected state until the initialization operation of all the internal circuits in the semiconductor memory is completed, thereby preventing data destruction due to erroneous writing.

In addition, the potential generated in the write word/bit line can be limited to a fixed value or a lower value by connecting the limiting circuit to the write word/bit line. As a result, in the magnetic random access memory having the cross point type cell array structure in particular, the magneto-resistive effect element can be prevented from being destroyed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A magnetic random access memory comprising:

a memory cell array determining an element having a magnetic layer as a memory cell;

a first write line used to write data in said memory cell;

a first decoder which selects said first write line based on a first address signal; and a first driver which is connected to one end of said first write line, and supplies a write current to said first write line when said first write line is selected by said first decoder, wherein said first decoder is maintained in a non-active state until an initialization operation of an internal circuit is completed after turning on a power supply.

2. The magnetic random access memory according to claim 1, further comprising:

a power-on detection circuit which outputs a signal indicative of completion of said initialization operation of said internal circuit, wherein said first decoder enters an active state upon receiving said signal.

3. The magnetic random access memory according to claim 1, further comprising:

a limiting circuit which is connected to said first write line and limits a potential generated in said first write line to a fixed value or a lower value.

4. The magnetic random access memory according to claim 3, wherein said limiting circuit is constituted by at least one of a MOS transistor or a diode.

5. The magnetic random access memory according to claim 1, further comprising:

a second write line which is used to write data in said memory cell and crosses said first line;

a second decoder which selects said second write line based on a second address signal; and a second driver which is connected to one end of said second write line, and supplies a write current to said second write line when said second write line is selected by said second decoder, wherein said second decoder is maintained in said non-active state until said initialization operation of said internal circuit is completed after turning on said power supply.

6. The magnetic random access memory according to claim 5, further comprising:

a third decoder which selects said second write line based on said second address signal; and a third driver which is connected to the other end of said second write line, and supplies a write current to said second write line when said second write line is selected by said third decoder, wherein said third decoder is maintained in said non-active state until said initialization operation of said internal circuit is completed after tuning on said power supply.

7. The magnetic random access memory according to claim 6, wherein said first write line is a write word line, said first driver is a write word line driver, said second write line is a write bit line, and said second and third drivers are write bit line drivers.

8. The magnetic random access memory according to claim 6, further comprising:

a power-on detection circuit which outputs a signal indicative of completion of said initialization operation of said internal circuit, wherein said first, second and third decoders enter said active state upon receiving said signal.

9. The magnetic random access memory according to claim 6, further comprising:

a first limiting circuit which is connected to said first write line, and limits a potential generated in said first write line to a fixed value or a lower value; and a second limiting circuit which is connected to said second write line, and limits a potential generated in said second write line to a fixed value or a lower value.

10. The magnetic random access memory according to claim 9, wherein each of said first and second limiting circuits is constituted by at least one of an MOS transistor and a diode.

11. The magnetic random access memory according to claim 9, wherein said memory cell array has a cross point type cell array structure.

* * * * *